United States Patent [19]
Derkits, Jr. et al.

[11] Patent Number: 5,559,817
[45] Date of Patent: Sep. 24, 1996

[54] COMPLAINT LAYER METALLIZATION

[75] Inventors: Gustav E. Derkits, Jr., New Providence; Jose A. Lourenco, Union; Ramesh R. Varma, Berkeley Heights, all of N.J.

[73] Assignee: Lucent Technologies Inc., Murray Hill, N.J.

[21] Appl. No.: 344,448

[22] Filed: Nov. 23, 1994

[51] Int. Cl.$^6$ .............................. H01S 3/19; H01L 23/48
[52] U.S. Cl. .................... 372/36; 257/753; 257/772; 257/44
[58] Field of Search ...................... 428/620, 622, 428/637, 669, 670, 672; 372/36, 43–46; 257/772, 753

[56] References Cited

U.S. PATENT DOCUMENTS

4,350,990  9/1982  Lo ............................................ 372/44
4,929,516  5/1990  Pryor et al. ............................. 372/36

Primary Examiner—James W. Davie

[57] ABSTRACT

A compliant layer metallization for relieving thermal and mechanical stress developed between a semiconductor and a semiconductor submount. The compliant layer metallization includes a compliant layer, a wetting layer and a barrier layer. The compliant layer provides thermal and mechanical stress relief. The wetting layer ensures adequate wetting during soldering. The barrier layer prevents diffusion of bonding material into the compliant layer and/or into the semiconductor during solder-bonding. The compliant layer metallization design promotes ease of manufacturing.

10 Claims, 10 Drawing Sheets

```
CP7060A   STD THICKNESS - 5,000A Au ON Ti/Pt (NON-CLM)
CP7060B   ON STD METALS, EVAP. 2μ Au; 2,000A Pt; 1,500 Au (CLM)

THERMAL CYCLING RESULTS:

1. FIRST T/C, 8 TIMES, -40° TO + 85°C:
         CP7060A    - 2/8 CRACKS (NON-CLM)
         CP7060B    - 0/7 CRACKS (CLM)

2. SECOND T/C, 10 CYCLES, -65° TO + 105°C:
         CP7060A    - 8/8 CRACKS (NON-CLM)
         CP7060B    - 2/7 CRACKS (CLM)

CONCLUSION:  CLEAR DIFFERENCE BETWEEN THE 2 LOTS. THE DEVICES WITH
             CLM APPEAR MORE RESISTANT TO CRACKING DURING THERMAL
             CYCLING.

CHIP PUSH OFF TEST -- SAME CHIPS USED FROM PREVIOUS TESTS
ALL CHIPS SEPARATED AT THE DIELECTRIC/SEMICONDUCTOR INTERFACE.
```

| 7060A (NON-CLM) | | 7060B (CLM) | |
|---|---|---|---|
| POSITION | FAIL FORCE (gm) | POSITION | FAIL FORCE (gm) |
| 1 | 726 CRACKED | 11 | 1,314 |
| 2 | * | 12 | 931 CRACKED |
| 3 | 510 CRACKED | 13 | 447 CRACKED |
| 4 | 673 CRACKED | 14 | 1,508 |
| 5 | 385 CRACKED | 15 | 851 |
| 6 | 556 CRACKED | 16 | 1,137 CRACKED DUE TO HANDLING |
| 7 | 395 CRACKED | 17 | 1,920 |
| 8 | 419 CRACKED | 18 | 1,281 |
| AVERAGE | 523.43 | | 1,173.63 |
| STD DEV | 136.14 | | 446.00 |

*PUSH-OFF ON SUBMOUNT

```
CONCLUSION:  AGAIN CLEAR DIFFERENCE BETWEEN THE 2 LOTS. DEVICES WITH CLM
             BREAK AT A HIGHER FORCE THAN STD CHIPS, EVEN THOUGH THE
             SEPARATION OCCURS AT THE SAME PLACE IN BOTH LOTS.
```

FIG. 7A

| CP7060A (NON-CLM) | | | | CP7060B (CLM) | |
|---|---|---|---|---|---|
| DEVICE | OBSERVATION | DEVICE | OBSERVATION | DEVICE | OBSERVATION |
| 11929-1 | HANDLING DAMAGE | 3631-1 | OK | 14205-1 | OK |
| 11929-2 | FC, MC | 3631-2 | OK | 14205-2 | OK |
| 11929-3 | MC | 3631-3 | OK | 14205-3 | OK |
| 11929-4 | FC | 3631-4 | OK | 14205-4 | OK |
| 11929-5 | OK | 3631-5 | OK | 14205-5 | OK |
| 11929-6 | OK | 3631-6 | OK | 14205-6 | OK |
| 11929-7 | FC | 3631-7 | OK | 14205-7 | OK |
| 11929-8 | OK | 3631-8 | OK | 14205-8 | OK |
| 11929-9 | FC | 3631-9 | OK | 14205-9 | OK |
| 11929-10 | OK | 3631-10 | OK | 14205-10 | OK |
| 13510-1 | MC | 4304-1 | OK | 14728-1 | OK |
| 13510-2 | FC | 4304-2 | OK | 14728-2 | OK |
| 13510-3 | OK | 4304-3 | OK | 14728-3 | OK |
| 13510-4 | OK | 4304-4 | FC | 14728-4 | OK |
| 13510-5 | MC | 4304-5 | OK | 14728-5 | OK |
| 13510-6 | OK | 4304-6 | OK | 14728-6 | OK |
| 13510-7 | FC | 4304-7 | MC | 14728-7 | OK |
| 13510-8 | OK | 4304-8 | OK | 14728-8 | MC |
| 13510-9 | OK | 4304-9 | OK | 14728-9 | OK |
| 13510-10 | MC | 4304-10 | OK | | |
| 13655-1 | FC | 12475-1 | OK | | |
| 13655-2 | OK | 12475-2 | OK | FC = B-FACET CRACK | |
| 13655-3 | MC | 12475-3 | OK (?) | | |
| 13655-4 | FC, MC | 12475-4 | OK | MC = CRACK THROUGH MIDDLE OF CHIP | |
| 13655-5 | FC | 12475-5 | OK | | |
| 13655-6 | OK | 12475-6 | OK | OK (?) = HARD TO TELL IF CRACKED | |
| 13655-7 | OK (?) | 12475-7 | OK | | |
| 13655-8 | OK | 12475-8 | OK (?) | DEVICE THICKNESS: | |
| 13655-9 | MC | 12475-9 | OK | | |
| 13655-10 | FC (A-FACET) | 12475-10 | OK | NO DETECTABLE DIFFERENCE BETWEEN A AND B | |
| 13655-11 | FC | | | | |
| 13655-12 | MC | | | | |
| CP7060A (NON-CLM) | | | | CP7060B (CLM) | |
| SYMBOL | NUMBER | PERCENT | SYMBOL | NUMBER | PERCENT |

FIG. 7B

| | | | | | |
|---|---|---|---|---|---|
| FC | 11 | 34.38 | FC | 1 | 2.04 |
| MC | 9 | 28.13 | MC | 2 | 4.08 |
| OK (?) | 2 | 6.25 | OK (?) | 2 | 4.08 |
| OK | 12 | 37.50 | OK | 44 | 89.80 |
| DEVICES | 32 | | DEVICES | 49 | |

| RVB21660A | STD THICKNESS -- 5,000A Au ON Ti/Pt (NON-CLM) |
|---|---|
| RVB21660B | ON STD METALS, EVAPORATED 4µ Au; 2,000A Pt; 1,500A Au (CLM) |
| WSCP6719 | STD THICKNESS -- 5,000A Au ON Ti/Pt (NON-CLM) |
| WSCP6728 | ON STD METALS, EVAPORATED 4µ Au; 2,000A Pt; 1500A Au (CLM) |

VISUAL INSPECTION RESULTS OF As-BONDED DEVICES

| DEVICE | RVB21660A | RVB21660B | WSCP6719 | WSCP6728 |
|---|---|---|---|---|
| 1 | MC | OK | FC (A-FACET) | OK |
| 2 | FC | OK | OK | OK |
| 3 | OK | OK | FC | OK |
| 4 | OK | OK | OK | OK |
| 5 | OK | OK | FC | OK |
| 6 | OK | OK | FC | OK |
| 7 | OK | OK | FC | OK |
| 8 | OK | OK | OK | OK |
| 9 | OK | OK (?) | FC | OK |
| 10 | OK | OK | FC (A-FACET) | OK |
| 11 | OK | OK | FC | OK |
| 12 | OK | OK | OK | OK |
| 13 | FC | OK | FC | OK |
| 14 | OK | OK | FC | OK |
| 15 | OK | OK | FC | OK |
| 16 | OK | OK | FC | OK |
| 17 | OK | OK | FC | OK |
| 18 | FC | MC | OK | OK |
| 19 | OK | OK | OK | OK |
| 20 | OK | OK | FC (2-FACETS) | OK |
| 21 | OK | OK | FC (A-FACET) | OK |
| 22 | OK | OK | FC (A-FACET) | OK |
| 23 | OK | OK | FC (A-FACET) | OK |
| 24 | OK | OK | OK | OK |
| 25 | MC | MC | FC | OK |
| 26 | OK | OK | | OK |
| 27 | OK | OK | | |
| 28 | OK | OK | | |
| 29 | OK | OK | | |
| 30 | OK | | | |
| 31 | OK | | | |
| # DEVICES | 31 | 29 | 25 | 26 |
| # OK | 26 | 26 | 7 | 26 |
| # OK (?) | 0 | 1 | 0 | 0 |
| # FC | 3 | 0 | 18 | 0 |
| # MC | 2 | 2 | 0 | 0 |
| % OK | 84 | 90 | 28 | 100 |

FC = B-FACET CRACK
MC = CRACK THROUGH MIDDLE OF CHIP
OK (?) = HARD TO TELL IF CRACKED

FIG. 9

I. 20 GOOD DEVICES CHOSEN FROM EACH LOT

II. 10 DEVICES FROM EACH 20 WERE HEAT TREATED TO SIMULATE DEBONDING:

- DEVICE PLACED IN HOLDER AT 270°C
- TEMPERATURE HELD FOR 2 MINUTES
- DEVICE REMOVED FROM HOLDER AND COOLED QUICKLY

III. DEVICES THERMAL CYCLED 10 TIMES BETWEEN -40° AND +85°C

- 4 CELLS: STD Au/HEAT
  STD Au/NO HEAT
  THICK Au/HEAT
  THICK Au/NO HEAT

IV. VISUAL INSPECTION: NO FAILURES

V. DEVICES THERMAL CYCLED 20 TIMES BETWEEN -65° AND +105°C

| CELL | B-FACET CRACK | A-FACET CRACK | SURFACE CRACK |
|---|---|---|---|
| STD Au/HEAT | 1 | 2 | 1 |
| STD Au/NO HEAT | 2 | 2 | 3 |
| THICK Au/HEAT | 0 | 0 | 0 |
| THICK Au/NO HEAT | 0 | 0 | 0 |

```
PUSH OFF TEST OF NEW, NEVER THERMAL CYCLED CHIPS:
FIRST 5 FROM 7060B DONE FIRST, FOLLOWED BY ALL 7060A, AND THEN THE
REMAINING 7060B
```

| 7060A (NON-CLM) | | 7060B (CLM) | |
|---|---|---|---|
| POSITION | FAIL FORCE | POSITION | FAIL FORCE |
| 1 | 882 | 1 | 785 |
| 2 | 1,079 | 2 | 1,289 |
| 3 | 969 | 3 | 1,170 |
| 4 | 207 | 4 | 1,271 |
| 5 | 654 | 5 | 1,134 |
| 6 | 1,138 | 6 | 1,131 |
| 7 | 288 | 7 | 1,449 |
| 8 | 1,631 | 8 | 1,766 |
| 9 | 1,291 | 9 | 1,626 |
| 10 | 514 | 10 | 2,076 |
| AVERAGE | 905.30 | | 1,369.70 |
| STD DEV | 507.48 | | 370.95 |

CONCLUSION: THERE IS A DIFFERENCE BETWEEN THE 2 LOTS AT PUSH OFF, EVEN FOR THESE NON THERMAL-CYCLED DEVICES. THE DEVICES UTILIZING THE COMPLIANT LAYER METALLIZATION OF THE PRESENT INVENTION BREAK AT HIGHER FORCES.

THERE IS ALSO A LARGER VARIATION IN THE PUSH-OFF FORCE FOR THE STD DEVICES, WITH 6/10 FAILING BELOW 1,000 g, WHILE ONLY 1/10 OF THE DEVICES WITH CLM DID SO.

WAFERS:

LOT 1 -- RVB21660A NON-CLM, NEVER BONDED LASERS
LOT 2 -- RVB21660A NON-CLM, AS-BONDED LASERS
LOT 3 -- RVB21660A NON-CLM, BONDED/THERMAL-CYCLED LASERS
LOT 4 -- RVB21660B CLM, BONDED/THERMAL-CYCLED LASERS
LOT 5 -- CP7060A NON-CLM, AS BONDED LASERS

RESULTS:

LOT 1 -- NO INDICATION OF CRACKS

LOT 2 -- A SIGNIFICANT NUMBER OF CRACKS IN THE P-SIDE OF THE SEPARATED CHIPS, MOST STARTING ALONG THE EDGE OF THE BeAu STRIPE IN TWO PRIMARY ORIENTATIONS: (1) PARALLEL TO THE FACET; AND (2) AT APPROXIMATELY A 45 DEGREE ANGLE RELATIVE TO THE FACET CRACKS

LOT 3 -- SIMILAR TO LOT 2, CONFIRMING THAT SUBSEQUENT THERMAL CYCLING DOES NOT INDUCE NEW CRACKS, BUT SIMPLY INDUCES EXISTING CRACKS TO PROPAGATE

LOT 4 -- HAD A MUCH SMALLER INCIDENCE OF LINE CRACKS, BUT HAVE SOME SMALL GOUGE-OUTS

LOT 5 -- SIMILAR TO LOTS 2 & 3, BUT HAD A MUCH HIGHER INCIDENCE OF VISIBLE CRACKS AFTER BONDING

CONCLUSION:

THE CLM DEVICES INDICATED SUPERIOR RESISTANCE TO STRESS RELATED CRACKING OVER THE NON-CLM DEVICES

COMPLAINT LAYER METALLIZATION

BACKGROUND OF THE INVENTION

1. Field of the Invention

The present invention relates generally to bonding materials for semiconductors, and more specifically to a compliant layer metallization for solder bonding a semiconductor.

2. Description of the Related Art

In many applications, it is necessary to bond semiconductors and/or semiconductor devices to a support or submount. This bonding is typically accomplished through the use of various types of solder (e.g., hard solder or soft solder). Semiconductors bonded in this way, however, frequently experience cracking due to thermal expansion mismatch and differences in mechanical strength between the semiconductor material and the submount material. Cracks of this nature have potentially significant reliability implications because they are not always screened out by electrical testing at the device level. In addition, because bonding related stress cracks frequently originate inside the bond joint, they are also often difficult or impossible to detect visually.

To alleviate this semiconductor cracking problem, use of a "compliant layer" between the semiconductor material and the submount is well known in the art. Ideally, a compliant layer used in this manner should provide both thermal (e.g., heat spreading) relief as well as mechanical (e.g., plastic) relief while at the same time promote ease of manufacturing of the semiconductor assembly. In addition, the compliant layer must also act as a barrier to protect the semiconductor from diffusion of soldering material into the semiconductor during manufacturing. The use of compliant layers to alleviate this semiconductor cracking problem has been attempted previously, however each such attempt has failed to meet at least one of the aforementioned requirements.

For example, the use of "thick layers" to provide heat spreading and mechanical relief is well known. These thick layers are typically composed of a single metal compatible with the soldering procedure, yet capable of providing mechanical and/or thermal relief. Such layers are formed by repeatedly plating the semiconductor with the single metal until the desired thickness is achieved. Typical plated single metal thick layers are in the 10–15 micron range.

The disadvantages associated with plated thick layers as employed in the art are numerous. First, the use of multiple plating operations to achieve a desired thickness is both time consuming and costly. This is especially true in light of the precautions which must be taken due to the presence of large amounts of toxic liquid (cyanide) which presents both an environmental risk and a potential health hazard to workers. In addition, despite multiple plating operations, only a "single metal" thick layer will result from such a plating operation. This means that the metal selected will, at best, represent a compromise selection chosen to provide thermal and mechanical relief while at the same time providing some barrier protection and manufacturability. Such a compromise selection, therefore, can not optimally address each compliant layer design concern.

The use of "barrier layers" to prevent diffusion of soldering material into a semiconductor is also well known. Like plated thick layers, the barrier layers in use are typically composed of a single metal, and are applied to the semiconductor via a plating process. Because only a single metal is involved, such barrier layers also represent a compromise selection and therefore fail to optimally address each of the compliant layer design concerns detailed above.

Therefore, there exists anteed for a compliant layer for use in bonding a semiconductor to a submount which can provide thermal and mechanical relief sufficient to prevent stress related cracking of the semiconductor, while at the same time provide barrier protection and promote ease of manufacturing. Such a compliant layer must optimally address each of these concerns, and ideally should be adaptable to any semiconductor-submount configuration. In addition, if such a compliant layer could be constructed solely of noble metals, it could be used as a wire-bondable surface to provide both solder-bondability and wire-bondability with a single process.

SUMMARY OF THE INVENTION

The present invention is directed to a compliant layer metallization comprising a means for minimizing thermal and mechanically induced stress on a semiconductor during solder-bonding of the semiconductor to a semiconductor submount, ensuring adequate wetting during soldering of the semiconductor, and preventing diffusion of soldering material into the semiconductor. To achieve this, the compliant layer metallization of the present invention is disposed between the semiconductor and the semiconductor submount.

Alternatively, the compliant layer metallization of the present invention comprises a first means in contact with a semiconductor, a second means in contact with a semiconductor submount and a third means, disposed between the first means and the second means. The first means minimizes thermal and mechanically induced stress between the semiconductor and the semiconductor submount. The second means ensures-adequate wetting during soldering of the semiconductor onto the semiconductor submount. The third means prevents diffusion of soldering material into the first means and/or into the semiconductor during solder-bonding.

The first means may further comprise a metallic layer having sufficient thickness to substantially prevent cracking of the semiconductor caused by the transfer of stress to the semiconductor during cooling after solder-bonding the semiconductor to the semiconductor submount. The cracking is due to differences in thermal conductivity and the coefficient of thermal expansion between the semiconductor and the semiconductor submount. The first means may further comprise a layer of gold (Au) at least 2 micro-meters in thickness. The first means may further comprise a layer of gold (Au) approximately 4 micro-meters in thickness.

The second means may further comprise a metallic layer of suitable material to ensure adequate wetting during; solder-bonding of the semiconductor onto the semiconductor submount. The second means may further comprise a layer of gold (Au) at least 0.05 micro-meters in thickness. The second means may further comprise a layer of gold (Au) approximately 0.15 micro-meters in thickness.

The third means may further comprise a metallic layer of suitable material to prevent diffusion of soldering material into the first means and/or into the semiconductor during solder-bonding. The third means may further comprise a layer of platinum (Pt) at least 0.1 micro-meters in thickness. The third means may further comprise a layer of platinum (Pt) approximately 0.2 micro-meters in thickness.

Alternatively, the present invention may comprise a semiconductor laser, a semiconductor submount, and a compliant layer metallization disposed between the semiconductor laser and the semiconductor submount. The semiconductor submount may further comprise a diamond. The compliant layer metallization may further comprise a compliant layer, a wetting layer and a barrier layer. The compliant layer is in contact with the semiconductor, and minimizes thermal and mechanically induced stress between the semiconductor and the semiconductor submount. The wetting layer is in contact with the semiconductor submount, and ensures adequate wetting during solder-bonding of the semiconductor onto the semiconductor submount. The barrier layer is disposed between the compliant layer and the wetting layer, and prevents diffusion of soldering material into the compliant layer during solder-bonding.

The compliant layer may further comprise a layer of gold (Au) at least 2 micro-meters in thickness. The wetting layer may further comprise a layer of gold (Au) at least 0.05 micro-meters in thickness. The barrier layer may further comprise a layer of platinum (Pt) at least 0.1 micro-meters in thickness.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE FIGURES

The foregoing features and advantages of the present invention will be apparent from the following more particular description of the preferred embodiments of the invention, as illustrated in the accompanying drawings, wherein.

DETAILED DESCRIPTION OF THE PREFERRED EMBODIMENTS

Development of the Invention

Figure 1:
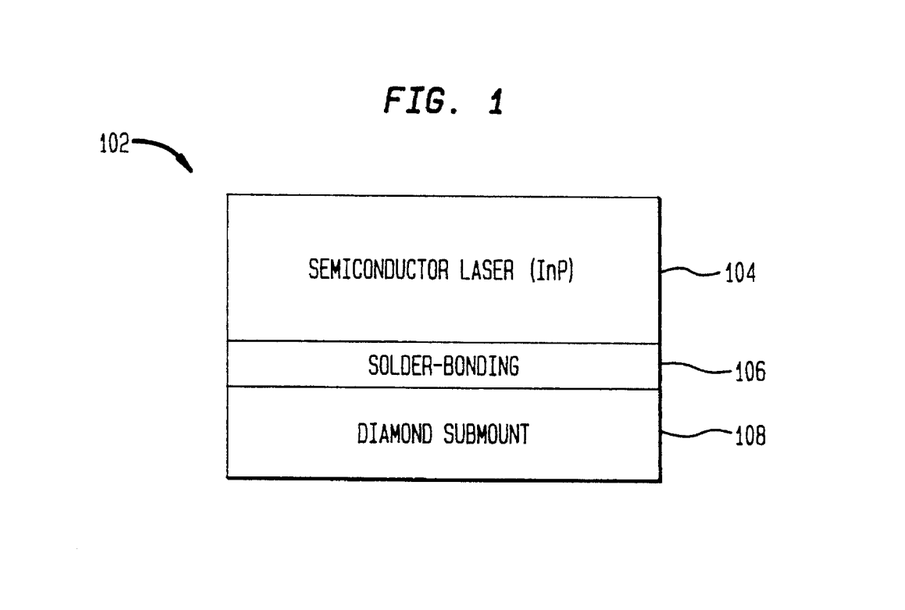
FIG. 1 depicts the structure of a semiconductor laser device used to evaluate the compliant layer metallization of the present invention.

The present invention was developed to solve a semiconductor chip cracking condition originally detected during the manufacture of semiconductor laser devices, but is equally applicable to any similarly constructed device. The semiconductor laser devices originally analyzed were constructed generally in accordance with FIG. 1. As seen in FIG. 1, the semiconductor laser device 102 is composed of an Indium Phosphide semiconductor laser 104 solder bonded to a diamond submount 108 using "hard solder" 106 (e.g., Gold/Tin (AuSn) solder). The predominant failure mode seen in such a device is a diagonal crack along the B-facet of the device. Other failure modes such as cracking across the A-facet or across the device itself are also possible.

Figure 2:
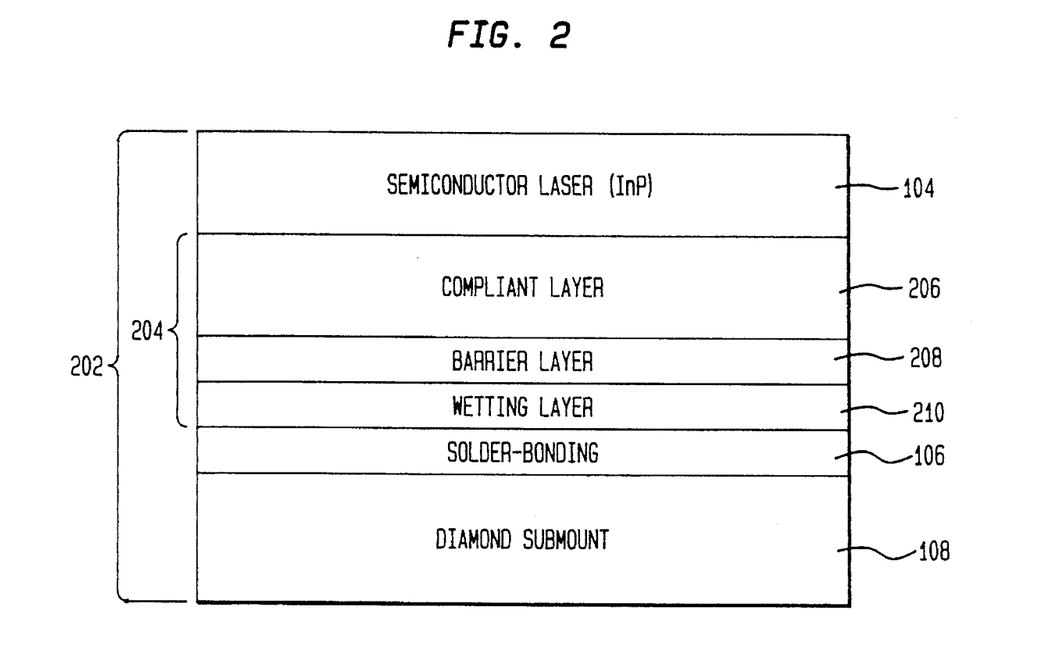
FIG. 2 depicts the structure of a semiconductor laser device incorporating a compliant layer metallization according to a preferred embodiment of the present invention.

The suspected cause of the semiconductor laser device cracking was interface stress along the solder-bonding 106 area. This stress occurs during thermal ramping of the mounted semiconductor laser device due to differences in the coefficient of thermal expansion and mechanical strength of the semiconductor material 104 versus the submount material 108. A series of experiments was undertaken to further analyze the chip cracking problem, as well as to develop an effective solution. FIG. 2 depicts the general configuration of a prototype 202 of the compliant layer metallization of the present invention 204.

Figure 3:
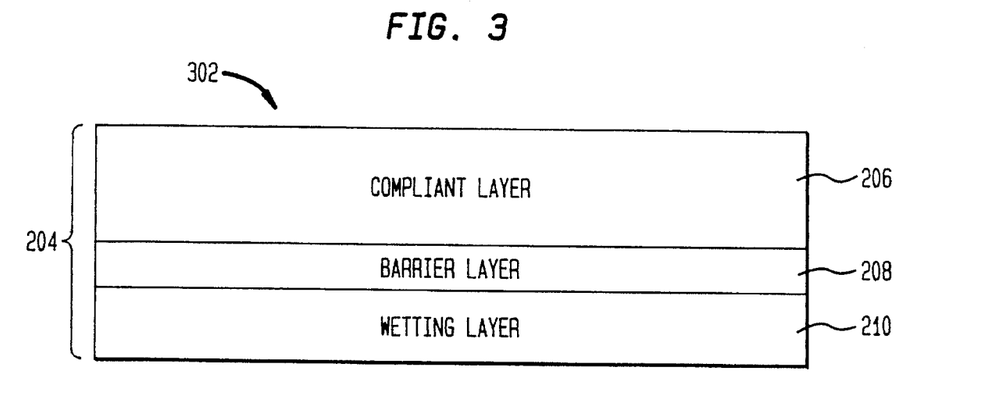
FIG. 3 depicts the structure of a compliant layer metallization according to a preferred embodiment of the present invention.

First, a compliant layer 206 was introduced on the p-side of the semiconductor laser 104 between the semiconductor interface surface 302 and the hard AuSn solder-bonding 106. Compliant layer 206 is preferably Gold (Au), chosen because of its high thermal conductivity as well as its ability to provide mechanical relief to the semiconductor device 104. Compliant layer 206 was sized to achieve an acceptable compromise between production yield, cost and stress transmitted to the semiconductor device 104 during post solder-bond cooling as well as during subsequent thermal cycling.

Next, a barrier layer 208 was introduced between-the compliant layer 206 and the hard solder-bonding 106. Barrier layer 208 is preferably composed of platinum (Pt). Barrier layer 208 was sized to prevent diffusion of the Tin (Sn) component of the AuSn solder-bonding 106 into the compliant layer 206 and/or into the semiconductor device 104.

Finally, a wetting layer 210 was introduced between barrier layer 208 and the AuSn solder-bonding 106. Wetting layer 210 is preferably composed of Gold (Au), which was selected and sized to provide adequate wetting of the AuSn solder 106 during bonding.

By developing a compliant layer 204 actually consisting of a multiplicity of layers (206, 208, 210), the shortcomings of previous compliant layers could be overcome. First, the material selected to perform the pure compliance function 206 could be selected to afford the greatest thermal and mechanical isolation to the semiconductor. In addition, the thickness of this layer could be varied to achieve optimal isolation, without affecting other desired properties. Next, the barrier layer 208 could be designed to achieve the desired diffusion protection, also without adversely affecting the desired functionality of the other layers. This design decision also involved selection of material as well as material thickness. Similarly, the wetting layer 210 could be designed to optimize the wetting characteristics without adversely affecting other parameters.

To optimize the overall design, a number of configurations were evaluated. Important developments are detailed below.

Evaluation of the Compliant Layer Metallization Concept

To evaluate the overall multi-layer design concept, a single semiconductor wafer was split into two sections prior to cleaving into bars. One piece ("A") was used as a control piece, and the other piece ("B") was used to evaluate the compliant layer metallization. A compliant layer 204 as shown in FIG. 3 was deposited on test piece B, with the associated layers as follows:

Compliant Layer 206: 20,000 Å Au

Barrier Layer 208: 2000 Å Pt

Wetting Layer 210: 1500 Å Au.

Figure 6:
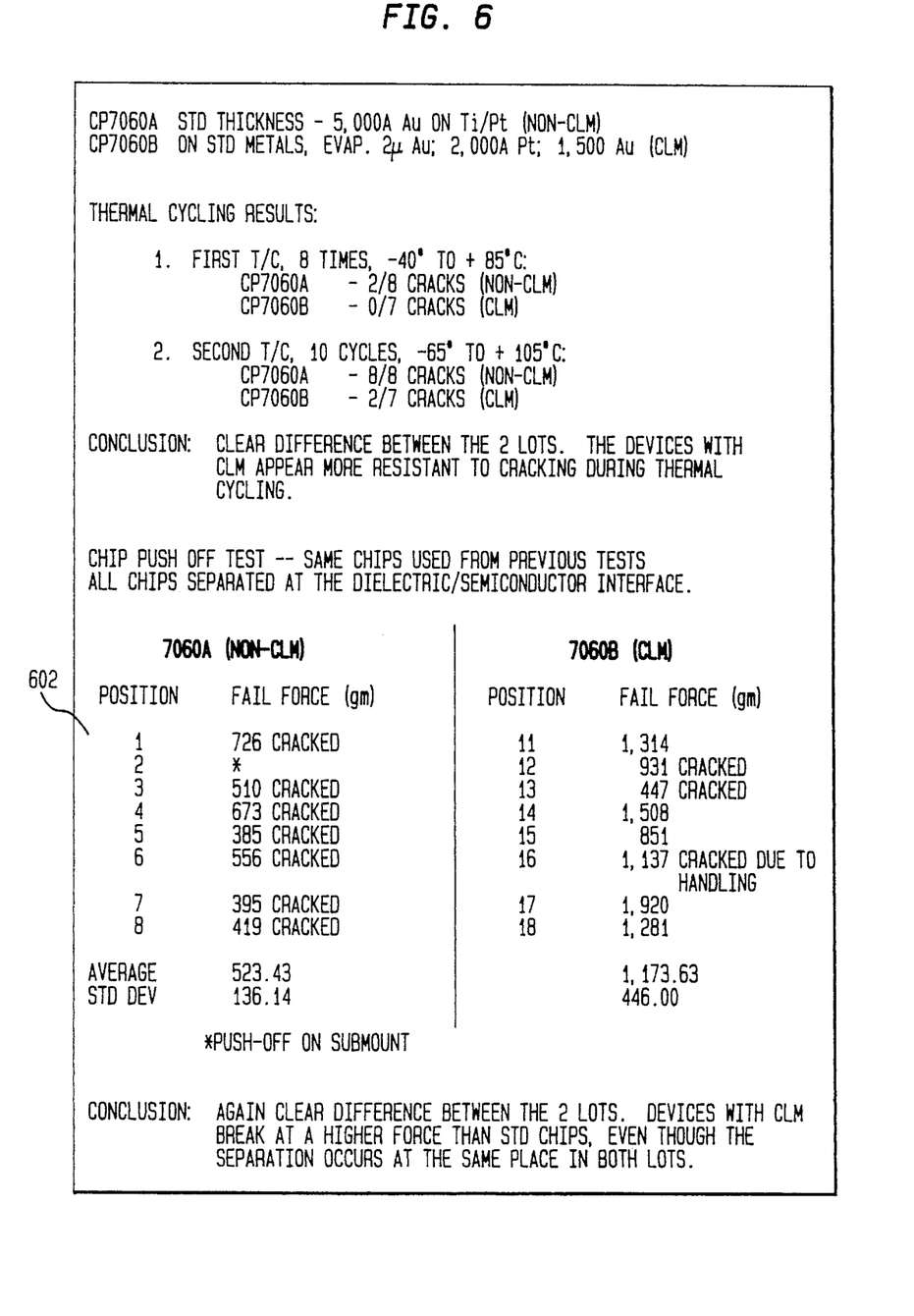
FIG. 6 depicts the results of thermal cycling and break force testing performed on a semiconductor laser device incorporating a compliant layer metallization according to a preferred embodiment of the present invention.

Both pieces were then cleaved into chips, bonded to submounts and subjected to thermal cycling. The results of these initial bonding and thermal cycling tests are presented in FIG. 6. As the data 602 show, there was a significant improvement in the mechanical condition of the chips with the compliant layer metallization. The devices with the compliant layer metallization exhibited fewer cracks after thermal cycling, and sustained higher push-off values during subsequent break force testing.

Figure 7A:
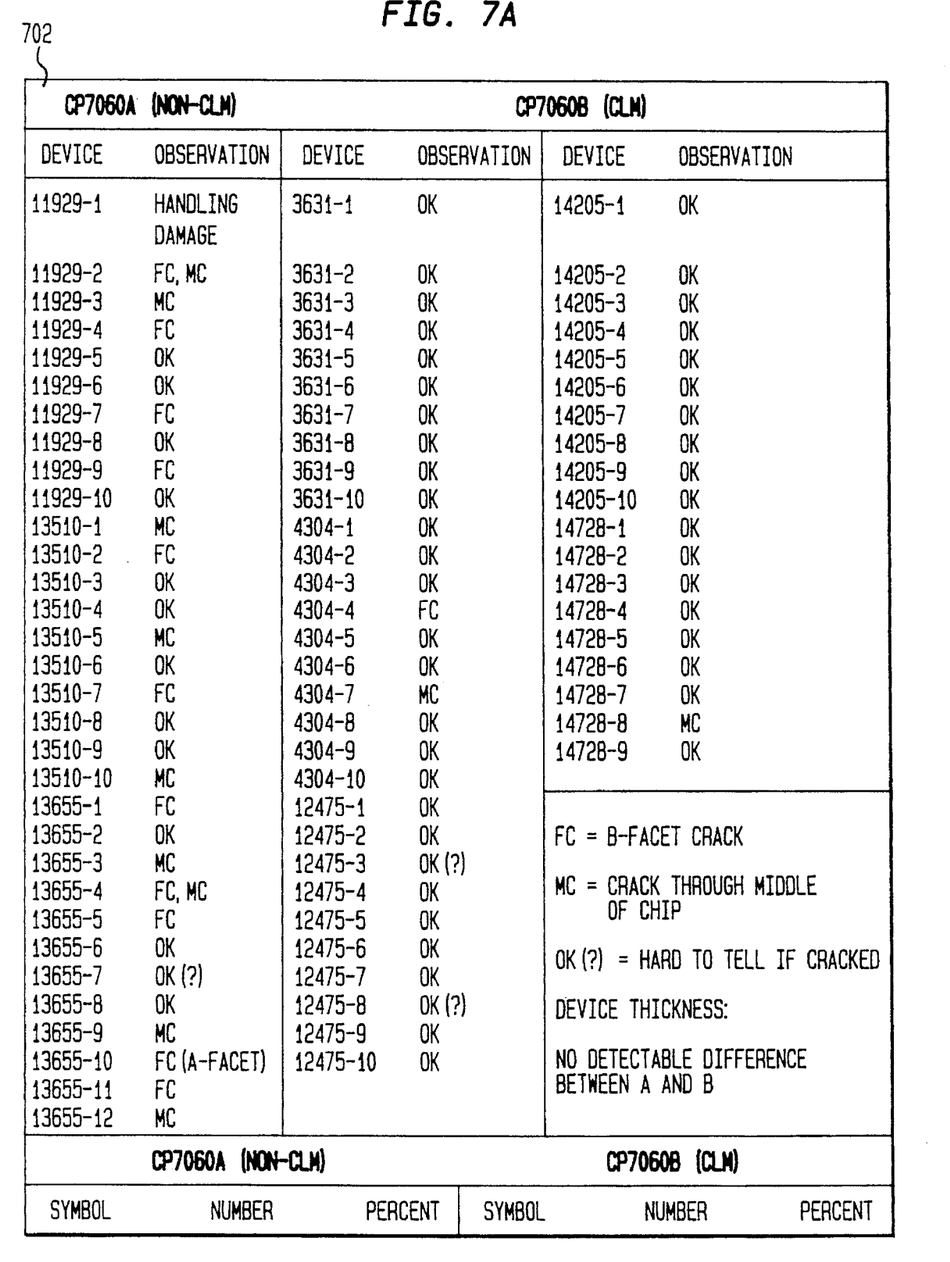
FIGS. 7A and 7B depict the results of post-bonding visual inspections performed before thermal cycling: on semiconductor laser devices incorporating a compliant layer metallization according to a preferred embodiment of the present invention.
Figure 7B:
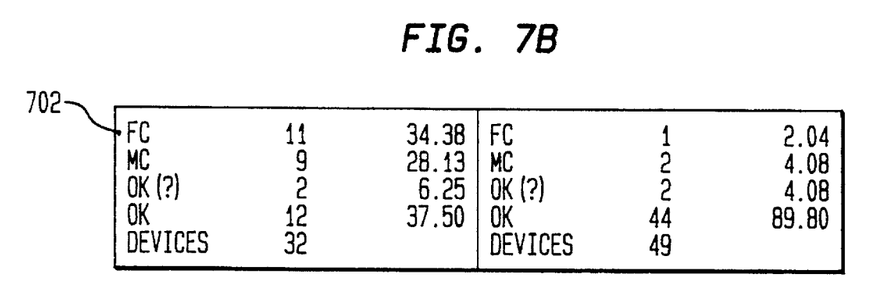

Following this initial test, another test was performed wherein a second set of devices made from the same two wafers was bonded onto submounts. This time, a visual inspection of the bonded devices was made prior to any thermal cycling. The data 702, presented in FIGS. 7A and 7B, indicate that many devices cracked merely as a result of the bonding process. In addition, as in the initial bonding and thermal cycling tests, the devices with the compliant layer metallization ("CLM") showed a significant improvement in mechanical condition as compared to the non-CLM devices.

Encouraged by these positive results, further development was undertaken to improve the performance of the compliant layer metallization. This time, the compliant layer metallization 204 was constructed, again per FIG. 3, with the associated layers as follows:

Compliant Layer 206: 40,000 Å Au

Barrier Layer 208: 2000 Å Pt

Wetting Layer 210: 1500 Å Au.

Figure 8:
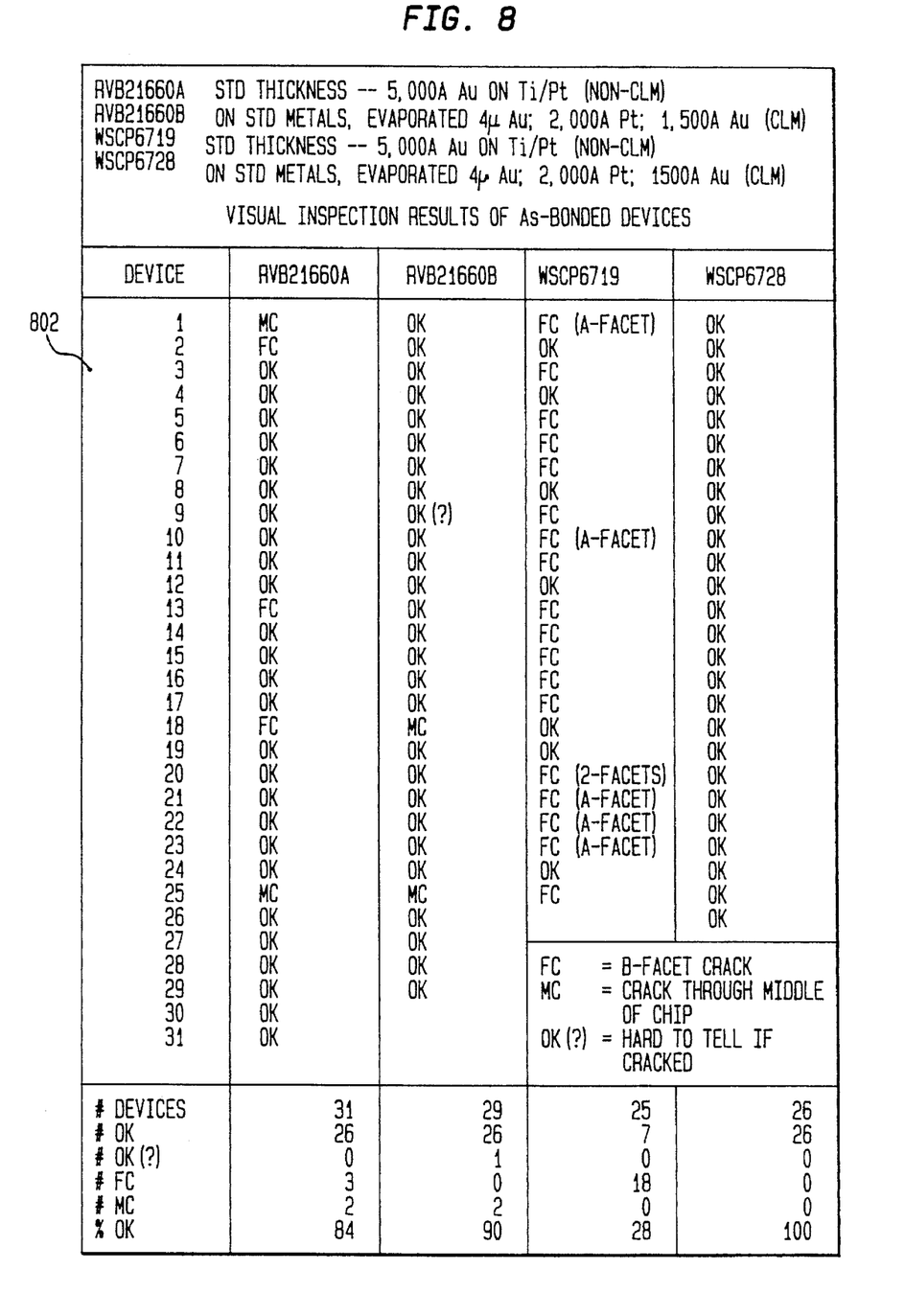
FIG. 8 depicts the results of further post-bonding visual inspections performed on semiconductor laser devices incorporating a compliant layer metallization according to a preferred embodiment of the present invention.

Two wafer types were selected fi>r testing, with the results presented in FIG. 8. As the data 802 show, the introduction of the compliant layer metallization 204 onto each chip type significantly reduced mechanical failures associated with thermal and mechanical bonding stresses. In addition, the results of testing performed with this thicker compliant layer showed improvement over the results obtained with the thinner layer 702.

Figure 9:
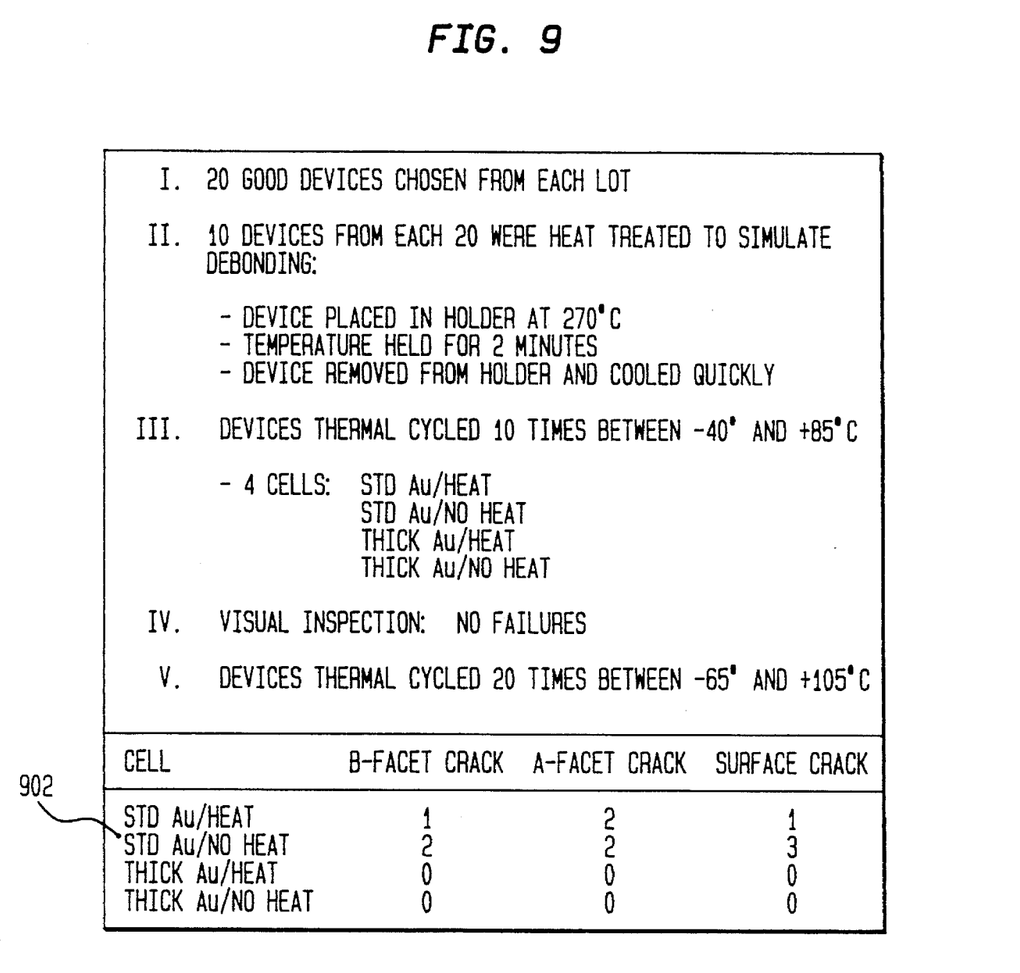
FIG. 9 depicts the effects of manufacturing related bond/debond/rebond operations on semiconductor laser devices incorporating a compliant layer metallization according to a preferred embodiment of the present invention.

Additional testing was also performed to determine if subsequent bond/debond/rebond operations (associated with semiconductor laser device manufacturing) followed by thermal cycling contributed to the chip cracking problem. The results of these tests 902, presented in FIG. 9, indicate that manufacturing related submount-platform bond/debond/rebond thermal cycling processes do not contribute significantly to the chip cracking problem. Nonetheless, the compliant layer metallization 204 under development provided additional protection to the semiconductor devices against failures resulting from this process as well.

To better understand the crack formation and propagation phenomenon, further analysis of failed semiconductors and the compliant layer metallization 204 invention was performed. Both mechanical strength testing as well as chemical etch and microscopy analysis was performed.

Mechanical Strength Testing

Figure 10:
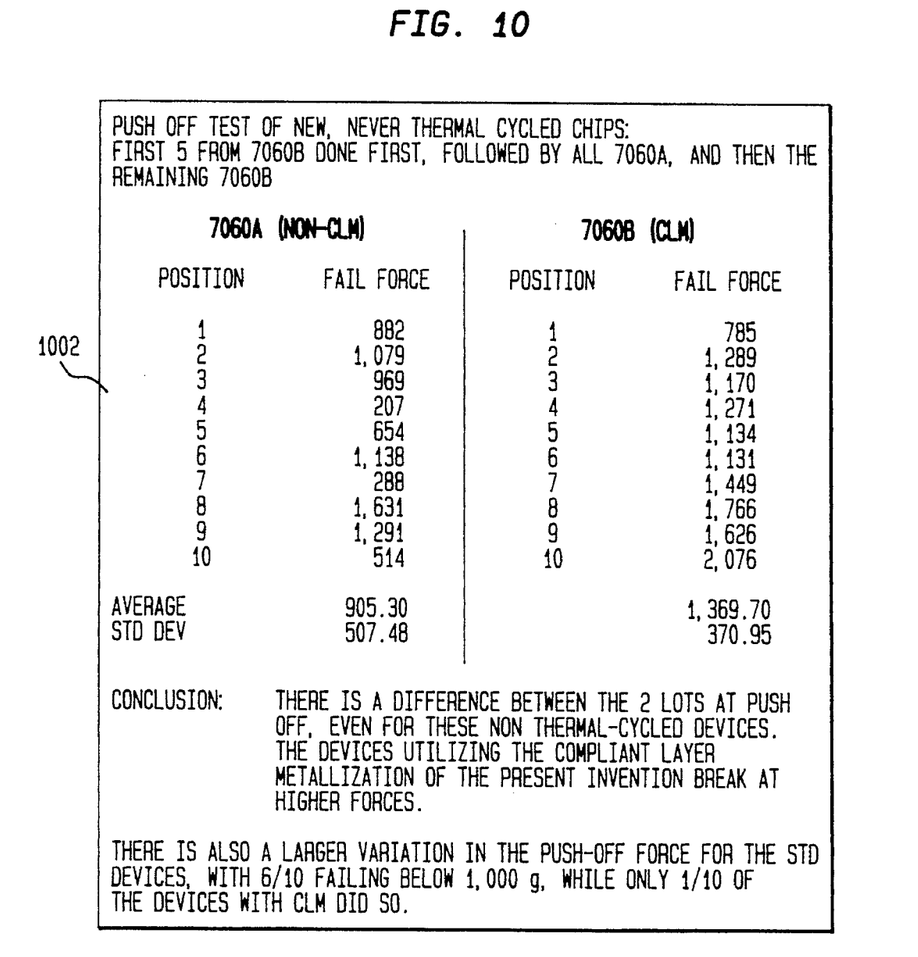
FIG. 10 depicts the results of "break force" testing on semiconductor laser devices incorporating a compliant layer, metallization according to a preferred embodiment of the present invention.

To evaluate the mechanical strength of the compliant layer metallization invention, a chip push-off test was, utilized. As in the initial bonding/thermal cycling evaluation, a control group and a test group of semiconductors was evaluated. Each group was bonded to a submount, and the chips were then separated at the dielectric/semiconductor interface. The force required to "break" the chips away from the submount was recorded, with the results presented in FIG. 10. As the data 1002 show, the "fail force" of the semiconductor devices coated with the compliant layer metallization 204 was, on average, significantly higher than that of the devices bonded using bonding techniques well known in the art. The compliant layer metallization 204 therefore offered improved mounting strength for bonded semiconductor devices.

Chemical Etch and Microscopy

Because crack formation frequently occurs underneath a semiconductor where it is not visually inspectable (e.g., inside the solder bond), chemical etch and microscopy was also employed to, better understand the failure mode. Under these analyses, a number of cracked semiconductor chips were debonded from submounts, mounted on a holder and etched. In addition, a number of bonded semiconductor chips were etched without removal from the submount to determine if the debonding process affected the results of the first etch analysis.

The semiconductors that were first debonded and then mounted on a holder were etched from the substrate side (n-side). A solution of 1:1:HCl:Phosphoric acid was used to completely remove the InP layer, exposing the thin quaternary cap layer. Subsequent optical microscopy revealed an array of microcracks along the BeAu stripe, primarily along the metal-dielectric interface. These results confirmed that cracks visible prior to etching were only a few of the cracks in the chip. Because the quaternary layer was so thin, it was conceivable that some of these cracks might have originated after the InP, which supplied some mechanical strength to the quaternary layer, had been removed. To isolate any potential effect due to the debonding-before-etching process, a second set of devices was etched while still bonded.

Figure 11:
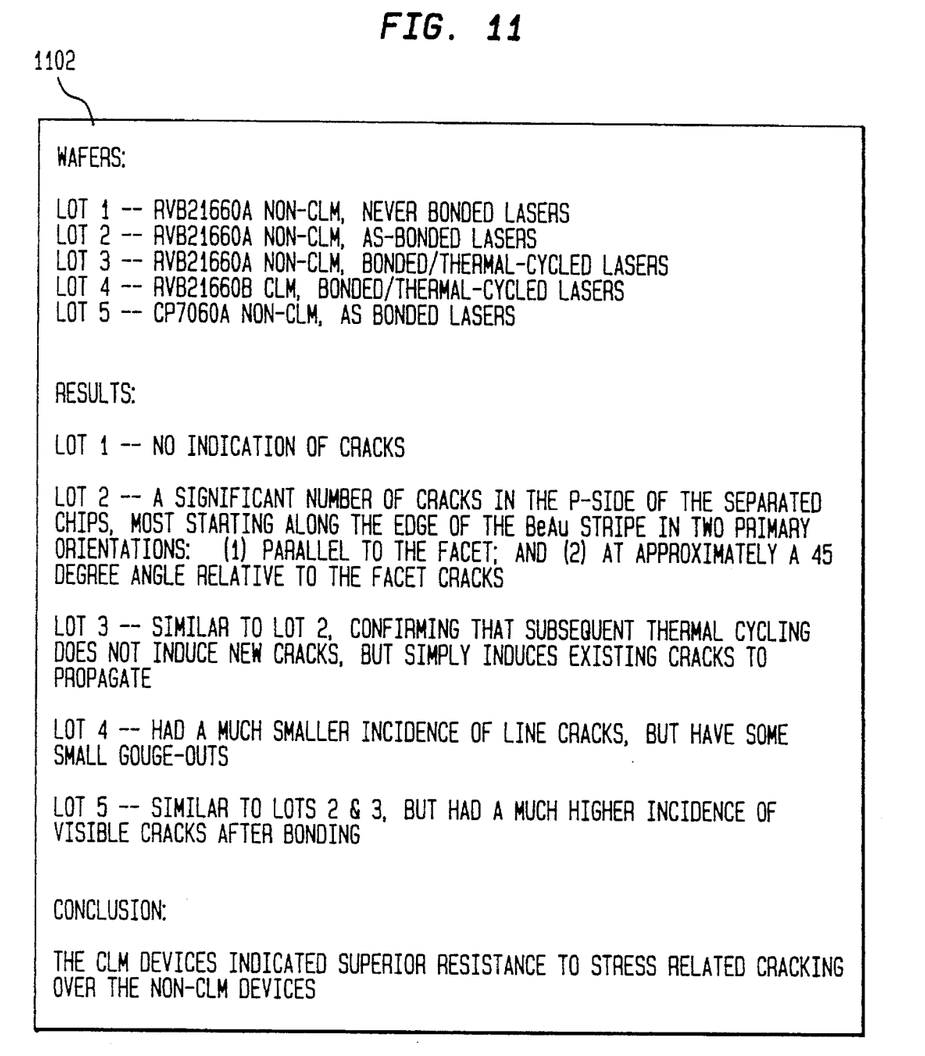
FIG. 11 depicts the results of chemical etch and microscopy performed on semiconductor laser devices incorporating a compliant layer metallization according to a preferred embodiment of the present invention.

The bonded semiconductors were etched in 1:1:HF:water, with the etchant attacking and undercutting the dielectric and the Ti layers between the semiconductor and the Pt film on the p-side. The entire semiconductor device was thus etch-separated from the submount, which left the BeAu stripe on the semiconductor surface, and permitted observation of the p-surface of the intact semiconductor chip. This analysis was performed on several different lots of devices, with the results 1102 depicted in FIG. 11. Optical microscopy of lots 2, 3, and 5 (non-CLM devices) revealed a significant number of cracks in the p-side of the separated chips, largely concentrated along the edge of the BeAu stripe. These cracks propagated under the BeAu toward the active stripe, or outward toward the edge of the chip, with some cracks reaching the edge of the chip. This analysis confirmed the results obtained after inspecting debonded chips where the InP had been etched off. Lot 3, which had been subjected to thermal cycling: following bonding, did not appear significantly different from lots 2 and 5, which were not subjected to post-bonding thermal cycling. This confirmed that the cracks were generated primarily during the initial chip bonding process. Importantly, Lot 4 (CLM devices) exhibited a much smaller incidence of line cracking.

The devices with the compliant layer metallization 204 that were bonded and thermal cycled (Lot 4 of FIG. 11) exhibited a much smaller incidence of line cracking than observed in the non-CLM devices. Once again, this showed that the compliant layer metallization 204 of the present invention offers numerous advantages over previous attempts to solve the problem.

Barrier Layer Evaluation

Figure 4:
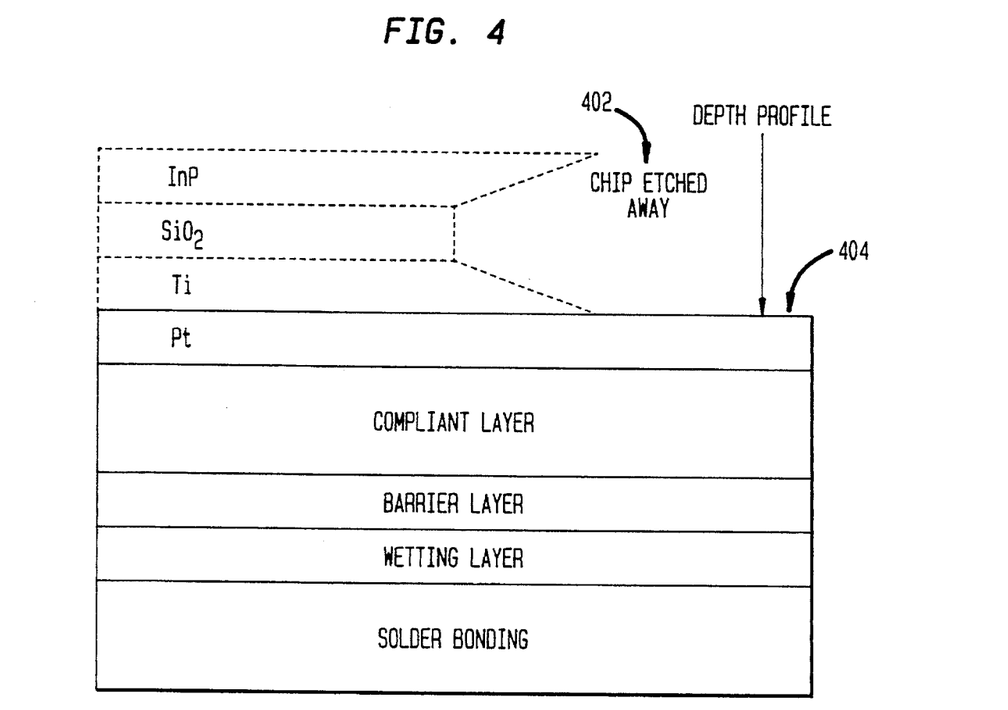
FIG. 4 depicts the Auger depth profile analysis used to evaluate barrier layer effectiveness of a compliant layer metallization according to a preferred embodiment of the present invention.

In addition to the mechanical evaluations, Auger depth profile analysis was performed to evaluate the effectiveness of barrier layer 208 of the compliant layer metallization 204. This analysis was performed on the p-side metallization of a chip incorporating a preferred embodiment of the compliant layer metallization 204 of the present invention. As shown in FIG. 4, the chip was bonded to AuSn and the InP-part 402 of the chip was etched away. This permitted depth profiling of the chip-metallization/AuSn bond 404 as shown in FIG. 4. Auger depth profile analysis was performed to verify that the Pt layer effectively prevented AuSn from interacting with the Au (gold) compliant layer.

Figure 5:
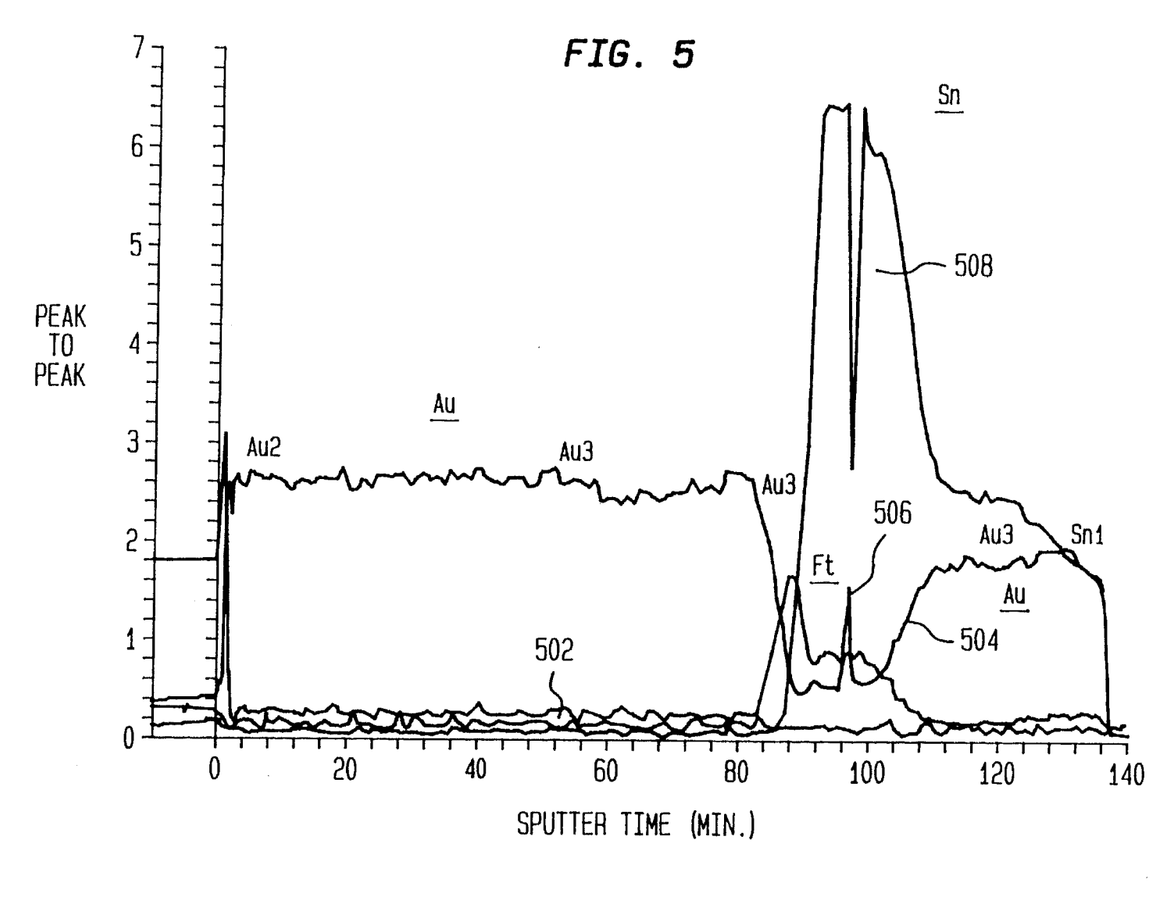
FIG. 5 depicts the results of an Auger depth profile analysis performed on a compliant layer metallization according to a preferred embodiment of the present invention.

FIG. 5 depicts the depth profile analysis, performed with a sputter etch rate of approximately 480 Å/min (Au). The first portion 502 of the 2000 Å Pt barrier appeared to be fully intact, while the second portion 504 appeared to have interacted with the AuSn to form a Sn-rich ternary phase. Although Sn did interact with the Pt barrier layer, the data showed no evidence of Sn penetrating the Pt barrier. The spike seen in the Sn and Au profiles at 96 rain sputter (506 and 508) is an artifact of the data acquisition and is not significant. Therefore, the 2000 Å Pt barrier was sufficient in stopping the AuSn bond material from interacting with the Au (gold) compliant layer.

Having reviewed the development of the present invention, a preferred embodiment is now described in detail, with further reference to the figures and tables. While specific steps, configurations and arrangements are discussed, it should be understood that this is done for illustrative purposes only. One skilled in the relevant art will recognize that other steps, configurations and arrangements can be used without departing from the spirit and scope of the invention.

DESCRIPTION OF A PREFERRED EMBODIMENT

The compliant layer metallization 204 of the present invention is depicted in FIG. 3, and includes a number of innovative features. These features include: (1) providing mechanical and/or thermal relief to a semiconductor bonded to a submount; (2) providing barrier effect to prevent diffusion of solder-bonding material into the compliant layer and/or into the semiconductor device; (3) providing a semiconductor bonding surface with superior wetting qualities to improve manufacturability; and (4) permitting independent variation of these features to allow the compliant layer metallization to be adapted to a wide range of semiconductor/bonding applications. These features are described in detail below.

It should first be understood that while the compliant layer metallization of the present invention was originally developed for use with semiconductor laser devices, it is equally well suited for use in any semiconductor application of similar construction. FIG. 3 is a schematic diagram of a preferred embodiment of the compliant layer metallization 204 of the present invention. The compliant layer metallization 204 is composed of three layers 206, 208, and 210. Layer 206 performs a compliance function. Layer 208 performs a barrier function. Layer 210 performs a wetting function. In use, compliant layer metallization 204 is disposed between a semiconductor and a semiconductor submount. Compliant layer 206 is in contact with the semiconductor, and wetting layer 210 is in contact with the submount/solder interface. Barrier layer 208 is sandwiched between compliant layer 206 and wetting layer 210.

Compliant layer 206 is preferably composed of gold (Au), which prevents cracking of the semiconductor due to thermal and mechanical stresses imparted on the semiconductor during thermal cycling. As discussed above, the use of gold (Au) to construct compliant layer 206 ensures that thermal and mechanical stresses applied to semiconductor devices will be minimized. This minimizing effect is due to gold's high thermal conductivity and ability to provide plastic relief. The thickness of compliant layer 206 may be varied to accommodate the requirements of specific semiconductor devices. A preferred thickness for the semiconductor laser device evaluated is 40,000 Å.

Next, barrier layer 208 is preferably composed of platinum (Pt), which prevents diffusion of solder-bonding material into compliant layer 206 and/or into the semiconductor. As detailed previously, platinum (Pt) is preferred for the barrier layer 208 because it is an effective barrier to the tin (Sn) component of the AuSn hard solder 106 frequently used to bond semiconductor devices. Platinum (Pt) is also preferred because it is compatible with the gold (Au) compliant layer 206. The thickness of barrier layer 208 may be varied to accommodate the requirements of specific semiconductor devices. A preferred thickness for the semiconductor laser device evaluated is 2000 Å.

Finally, wetting layer 210, preferably composed of gold (Au), provides a semiconductor bonding surface with superior wetting qualities to improve manufacturability. As determined during testing of the compliant layer metallization 204, gold (Au) is preferred because it is compatible with the platinum (Pt) barrier layer 208 and is also a highly effective wetting material. The thickness of wetting layer 210 may be varied to accommodate the requirements of specific semiconductor devices. A preferred thickness for the semiconductor laser device evaluated is 1500 Å.

The specific metals of the compliant layer metallization of the present invention may be applied by any means which is consistent with the other materials and processes used in manufacturing semiconductor laser devices. Examples of suitable processes include, but are not limited to, electron beam evaporation, sputtering, electroplating, thermal evaporation, or other means known to those skilled in the art.

While the present invention has been particularly shown and described with reference to a preferred embodiment thereof, it will be understood by those skilled in the art that various changes in form and details may be made therein without departing from the spirit and scope of the invention.

What is claimed is:

1. A semiconductor laser assembly comprising:

a semiconductor laser;

a semiconductor submount; and a compliant layer metallization disposed between said semiconductor laser and said semiconductor submount, comprising a compliant layer, in contact with said semiconductor laser to minimize thermal and mechanically induced stress between said semiconductor laser and said semiconductor submount, a wetting layer, in contact with said semiconductor submount, to ensure adequate wetting during soldering of said semiconductor laser onto said submount, and a barrier layer, disposed between said compliant layer and said wetting layer, to prevent diffusion of soldering material into said compliant layer during said soldering.

2. The semiconductor laser assembly of claim 1, wherein said semiconductor submount comprises a diamond.

3. The semiconductor laser assembly of claim 1, wherein said compliant layer comprises a layer of gold (Au) at least 2 micro-meters in thickness.

4. The semiconductor laser assembly of claim 1, wherein said wetting layer comprises a layer of gold (Au) at least 0.05 micro-meters in thickness.

5. The semiconductor laser assembly of claim 1, wherein said barrier layer comprises a layer of platinum (Pt) at least 0.1 micro-meters in thickness.

6. A semiconductor assembly comprising:

a semiconductor;

a semiconductor submount;

a compliant layer metallization disposed between said semiconductor and said semiconductor submount, comprising a compliant layer, in contact with said semiconductor, to minimize thermal and mechanically induced stress between said semiconductor and said semiconductor submount, a wetting layer, in contact with said semiconductor submount, to ensure adequate wetting during soldering of said semiconductor onto said semiconductor submount, and a barrier layer, disposed between said compliant layer and said wetting layer, to prevent diffusion of soldering material into said compliant layer during said soldering.

7. The semiconductor assembly of claim 6, wherein said semiconductor submount comprises a diamond.

8. The semiconductor assembly of claim 6, wherein said compliant layer comprises a layer of gold (Au) at least 2 micro-meters in thickness.

9. The semiconductor assembly of claim 6, wherein said wetting layer comprises a layer of gold (Au) at least 0.05 micro-meters in thickness.

10. The semiconductor assembly of claim 6, wherein said barrier layer comprises a layer of platinum (Pt) at least 0.1 micro-meters in thickness.

* * * * *